US008959268B2

(12) United States Patent
Hiraoka et al.

(10) Patent No.: US 8,959,268 B2
(45) Date of Patent: Feb. 17, 2015

(54) INFORMATION PROCESSING APPARATUS, SERIAL COMMUNICATION SYSTEM, METHOD OF INITIALIZATION OF COMMUNICATION THEREFOR AND SERIAL COMMUNICATION APPARATUS

(71) Applicant: Canon Kabushiki Kaisha, Tokyo (JP)

(72) Inventors: Takeshi Hiraoka, Tokyo (JP); Hiroki Asai, Fujisawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 203 days.

(21) Appl. No.: 13/646,103

(22) Filed: Oct. 5, 2012

(65) Prior Publication Data
US 2013/0238825 A1    Sep. 12, 2013

(30) Foreign Application Priority Data

Mar. 9, 2012 (JP) ................................. 2012-053680
Mar. 9, 2012 (JP) ................................. 2012-053681

(51) Int. Cl.
*G06F 13/42* (2006.01)

(52) U.S. Cl.
CPC ................................. *G06F 13/4286* (2013.01)
USPC ............ 710/105; 710/110; 713/400; 713/401

(58) Field of Classification Search
CPC . G06F 13/42; G06F 13/4252; G06F 13/4269; G06F 13/4282; G06F 13/4286
USPC ........................... 710/105, 110; 713/400, 401
See application file for complete search history.

(56) References Cited

U.S. PATENT DOCUMENTS

| 6,151,457 | A | 11/2000 | Kawamoto | |
|---|---|---|---|---|
| 8,667,194 | B2 * | 3/2014 | Dybsetter et al. | 710/110 |
| 2001/0023468 | A1 * | 9/2001 | Oh | 710/129 |
| 2011/0153887 | A1 * | 6/2011 | du Preez et al. | 710/106 |
| 2013/0090762 | A1 | 4/2013 | Asai et al. | 700/248 |

FOREIGN PATENT DOCUMENTS

| GB | 2354917 A * | 4/2001 |
|---|---|---|
| JP | 11-177744 A | 7/1999 |
| JP | 2006-135545 A | 5/2006 |

* cited by examiner

*Primary Examiner* — Glenn A Auve
(74) *Attorney, Agent, or Firm* — Fitzpatrick, Cella, Harper & Scinto

(57) ABSTRACT

The disclosure provides a technique of enabling to appropriately confirm the state of a partner apparatus in high-speed serial communication. An information processing apparatus includes a master and a slave which is connected with the master by a plurality of signal lines. The master and the slave are configured to perform a handshake by changing a signal level of a respective data signal line for a period of time longer than a cycle of a clock each other.

10 Claims, 14 Drawing Sheets

F I G. 1
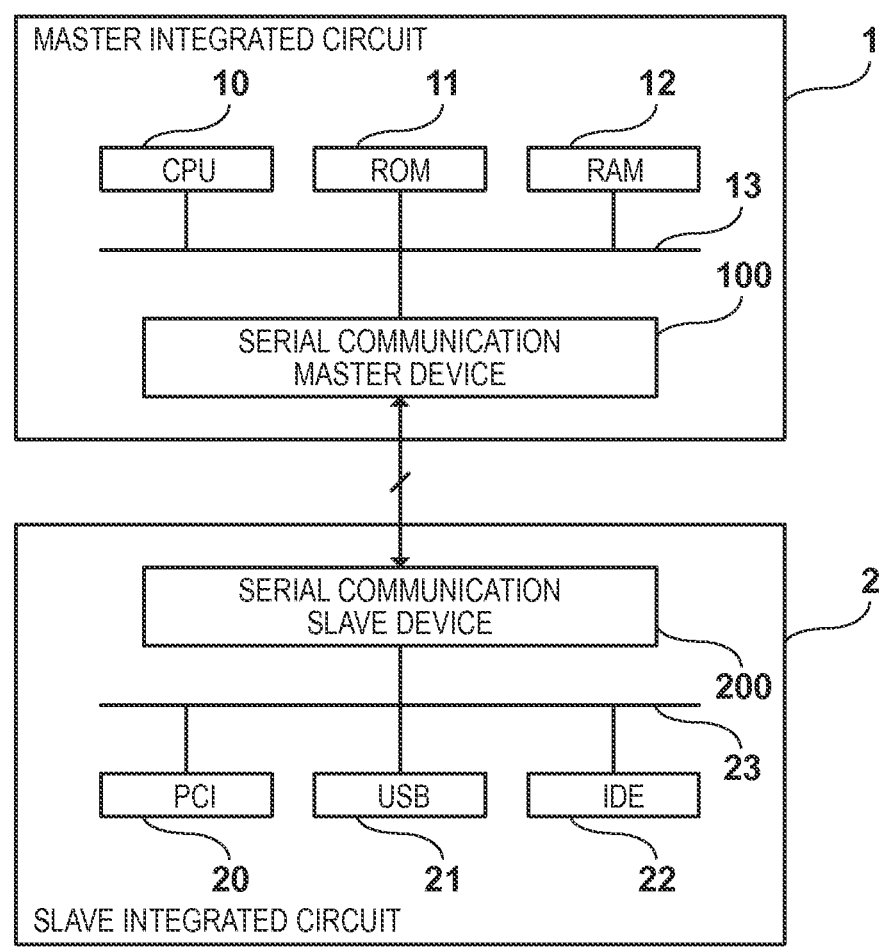

INFORMATION PROCESSING APPARATUS, SERIAL COMMUNICATION SYSTEM, METHOD OF INITIALIZATION OF COMMUNICATION THEREFOR AND SERIAL COMMUNICATION APPARATUS

BACKGROUND

Along with improvement in the degree of integration and in the processing capacity of an integrated circuit, the amount of data exchanged between a plurality of integrated circuits is increasing, and thus, it is desirable that the data rate increases. The data rate can be increased by transmitting data in parallel, which, however, raises the cost because the number of terminals of an integrated circuit increases, and makes skew adjustment between data difficult. In recent years, therefore, a high-speed serial transmission method is often adopted.

DESCRIPTION

The serial transmission method is roughly classified into an embedded clock method and a source synchronous method. In the embedded clock method, a clock component is embedded in a data signal, and the reception side extracts a clock and data from a data sequence, thereby making communication. The reception side, therefore, needs a mechanism for extracting clock information embedded in data. As a result, the scale of the integrated circuit increases, thereby raising the cost. Note that in the embedded clock method, since no time difference (phase shift/skew) between a clock and data theoretically occurs, high-speed transmission and long-distance transmission are easy. On the other hand, in the source synchronous method, the transmission side transmits a clock independent of data, and the reception side uses the received clock to sample the data, thereby making communication. This method has an advantage that the arrangement is simple. A reception time difference, however, may occur by separate transmission of a clock and data, thereby causing a failure of correct data reception. In particular, recent high-speed operations on the order of several hundred MHz to GHz require a mechanism (calibration) of adjusting a phase shift between a clock and data.

In general, in serial communication, a procedure for setting apparatuses to a communicable state, which is called initialization, is executed prior to actual data transmission. This procedure includes decision whether the apparatuses are physically connected with each other, decision whether it is possible to start initialization for a connection destination (checking whether power-on and reset processes are complete), and timing adjustment (adjustment of a phase shift or communication speed). For example, Japanese Patent Laid-Open No. 2006-135545 (patent literature 1) discloses the following technique. That is, in serial communication using the source synchronous method, an apparatus main body notifies, by changing the level of a command signal, that communication has started, and an external apparatus detects the change in the level of the command signal, thereby determining start of communication. Furthermore, Japanese Patent Laid-Open No. 11-177744 (patent literature 2) discloses the following technique. That is, a master apparatus generates random data, adds a CRC (Cyclic Redundancy Check) code to the data sequence, and transmits the data to a slave apparatus. Then, the slave apparatus performs CRC error checking. If there is no error, the slave apparatus notifies the master apparatus of it, thereby determining whether communication is possible.

In recent integrated circuit systems, however, ON/OFF of a power/reset button may often occur for power saving. If a notification of a change in signal level is sent during power-on or reset processing of a partner integrated circuit, an opportunity to detect the change in signal level may be missed, thereby incorrectly determining whether communication is possible.

In serial communication using the source synchronous method, it is impossible to discriminate, based on a signal state on a data signal line, between an unconnected state and a state in which there is no transmission operation in a connected state, unlike the embedded clock method. Therefore, it is possible to detect a state by only exchanging data with a partner apparatus.

The technique described in patent literature 1 assumes that a partner integrated circuit is in a stable state after power-on and reset processes. In the technique described in patent literature 2, there is no guarantee that correct data is always received because a phase shift may be significant in initialization after power-on in recent high-speed serial communication. Thus, it may be impossible to discriminate between an unconnected state and a phase shift state, thereby disabling to decide whether communication is possible.

SUMMARY

The present disclosure provides a technique of enabling to appropriately confirming the state of a partner apparatus in high-speed serial communication.

According to one aspect of the present disclosure, an information processing apparatus includes a master and a slave which is connected with the master by a plurality of signal lines to be able to make serial communication therewith, wherein the master and the slave are configured to perform a handshake when the master changes a signal level of a first data signal line included in the plurality of signal lines from a first signal level to a second signal level for a period of time longer than a cycle of a clock transmitted to the slave through a clock signal line of the plurality of signal lines, and the slave changes, based on the fact that the master has changed the signal level of the first data signal line to the second signal level, a signal level of a second data signal line included in the plurality of signal lines from the first signal level to the second signal level for a period of time longer than a cycle of a clock transmitted to the master through a clock signal line of the plurality of signal line.

According to another aspect of the present disclosure, a serial communication system including a master apparatus and a slave apparatus, wherein the master apparatus and the slave apparatus are connected by: a first clock signal line configured to transmit a first clock signal from the master apparatus to the slave apparatus, a first data signal line configured to transmit a first data signal from the master apparatus to the slave apparatus, a second clock signal line configured to transmit a second clock signal from the slave apparatus to the master apparatus, and a second data signal line configured to transmit a second data signal from the slave apparatus to the master apparatus, the master apparatus comprises: a first driving unit configured to control to assert the first data signal line for a period of time longer than at least a cycle of the first clock signal, a first decision unit configured to decide whether the second data signal line has been asserted, a first cancellation unit configured to control to cancel, when the first decision unit detects that the second data signal line has been asserted for a period of time longer than at least a cycle of the second clock signal after the first driving unit asserted the first data signal line, the assertion of the first data signal line, and a first state decision unit configured to decide, when the first decision unit detects that the second data signal line has not been asserted for a period of time longer than at least the cycle of the second signal after the first cancellation unit canceled the assertion of the first data signal line, that the slave apparatus is in a communicable state, and the slave apparatus comprises: a second decision unit configured to decide whether the first data signal line has been asserted, a second driving unit configured to control to assert, when the second decision unit detects that the first data signal line has been asserted for a period of time longer than at least the cycle of the first clock signal, the second data signal line for a period of time longer than at least the cycle of the second clock signal, and a second state decision unit configured to control to cancel, when the second decision unit detects that the first data signal line has not been asserted for a period of time longer than at least the cycle of the first signal after the second driving unit asserted the second data signal line, the assertion of the second data signal line while deciding that the master apparatus is in a communicable state.

According to still another aspect of the present disclosure, a method of initialization of communication for an information processing apparatus including a master and a slave which is connected with the master by a plurality of signal lines to be able to make serial communication therewith, the method comprises: causing the master to change a signal level of a first data signal line included in the plurality of signal lines from a first signal level to a second signal level for a period of time longer than a cycle of a clock transmitted to the slave through a clock signal line of the plurality of signal lines, and causing the slave to change, based on the fact that the master has changed the signal level of the first data signal line to the second signal level, a signal level of a second data signal line included in the plurality of signal lines from the first signal level to the second signal level for a period of time longer than a cycle of a clock transmitted to the master through a clock signal line of the plurality of signal lines.

According to yet another aspect of the present disclosure, a method of initialization of communication for a serial communication system includes a master apparatus and a slave apparatus, wherein the master apparatus and the slave apparatus are connected by: a first clock signal line configured to transmit a first clock signal from the master apparatus to the slave apparatus, a first data signal line configured to transmit a first data signal from the master apparatus to the slave apparatus, a second clock signal line configured to transmit a second clock signal from the slave apparatus to the master apparatus, and a second data signal line configured to transmit a second data signal from the slave apparatus to the master apparatus, the method comprises: controlling the master apparatus to assert the first data signal line for a period of time longer than at least a cycle of the first clock signal, controlling the slave apparatus to assert, when it is detected that the first data signal line has been asserted for a period of time longer than at least the cycle of the first clock signal, the second data signal line for a period of time longer than at least a cycle of the second clock signal, controlling the master apparatus to cancel, when it is detected that the second data signal line has been asserted for a period of time longer than at least the cycle of the second clock signal after the first data signal line was asserted in the controlling the master apparatus to assert, the assertion of the first data signal line, controlling the slave apparatus to cancel, when it is detected that the first data signal line has not been asserted for a period of time longer than at least the cycle of the first clock signal after the second data signal line was asserted in the controlling the slave apparatus to assert, the assertion of the second data signal line while deciding that the master apparatus is in a communicable state, and causing the master apparatus to decide, when it is detected that the second data signal line has not been asserted for a period of time longer than at least the cycle of the second clock signal after the assertion of the first data signal line was cancelled in the controlling the master apparatus to cancel, that the slave apparatus is in a communicable state.

According to still yet another aspect of the present disclosure, a serial communication apparatus comprises: a first clock terminal configured to transmit a first clock signal to a first clock signal line; a first data terminal configured to transmit a first data signal to a first data signal line; a second clock terminal configured to receive a second clock signal from a second clock signal line; a second data terminal configured to receive a second data signal from a second data signal line; and a decision unit configured to decide whether the serial communication apparatus and a communicable partner apparatus are connected via the first clock terminal, the first data terminal, the second clock terminal, and the second data terminal, the decision unit comprises: a driving unit configured to control to assert the first data signal line for a period of time longer than at least a cycle of the first clock signal, a decision unit configured to decide whether the second data signal line has been asserted, a cancellation unit configured to control to cancel, when the decision unit detects that the second data signal line has been asserted for a period of time longer than at least a cycle of the second clock signal after the driving unit asserted the first data signal line, the assertion of the first data signal line, and a connection decision unit configured to decide, when the decision unit detects that the second data signal line has not been asserted for a period of time longer than at least the cycle of the second clock signal after the cancellation unit canceled the assertion of the first data signal line, that the communicable partner apparatus is connected.

Further features of the present disclosure will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 1 is a block diagram showing an example of the arrangement of an information processing device including a serial communication system;

DESCRIPTION OF THE EMBODIMENTS

Figure 2:
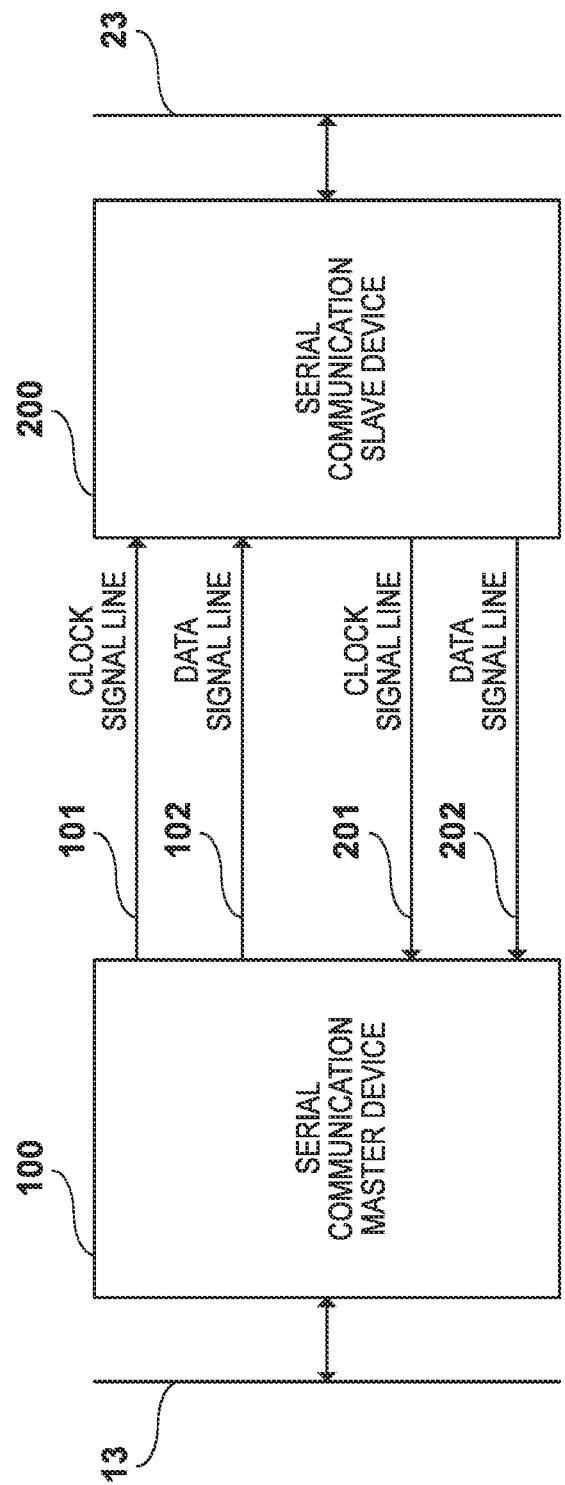
FIG. 2 is a block diagram showing connection between serial communication devices.

Preferred embodiments of the present invention will be described below in detail with reference to the accompanying drawings. Note that the following embodiments are merely examples, and do not limit the scope of the present invention.

An information processing device including two integrated circuits for making bi-directional serial communication will be exemplified as a serial communication system according to an embodiment.

<Arrangement of Device>

FIG. 1 is a block diagram showing an example of the arrangement of an information processing device including a serial communication system. In the information processing device, a CPU 10, a ROM 11, and a RAM 12 are connected with a first bus 13, and a PCI 20, a USB 21, and an IDE 22 are connected with a second bus 23. The first bus 13 is connected to the second bus 23 via a serial communication master device 100 and a serial communication slave device 200. This arrangement includes a two-chip set, which is the representative arrangement of a general-purpose computer. An integrated circuit 1 includes the serial communication master device 100, and an integrated circuit 2 includes the serial communication slave device 200 which is connected with the serial communication master device 100 to be able to make serial communication.

The CPU 10 maps a program stored in the ROM 11 on the RAM 12, and executes the program. The PCI 20, USB 21, and IDE 22 connected with the second bus 23 serve as control units (that is, controllers for PCI, USB, and IDE interfaces) for controlling various peripherals (not shown), respectively.

For example, the serial communication master device 100 transmits, to the serial communication slave device 200 by serial communication using a source synchronous method, data which is input from the RAM 12 according to a predetermined protocol on the first bus 13. Then, the serial communication slave device 200 transmits the data input from the serial communication master device 100 to the various peripherals according to a predetermined protocol on the second bus 23.

Note that the protocol on the first bus 13 need not be the same as that on the second bus 23. The configuration of the serial communication system in the information processing device is not limited to that shown in FIG. 1, and an arbitrary configuration which is similar to that of a known serial communication system using the source synchronous method is applicable.

FIG. 2 is a block diagram showing connection between the serial communication devices. The serial communication master device 100 and the serial communication slave device 200 are connected with each other to perform bi-directional serial communication using the source synchronous method.

The serial communication master device 100 is connected with a clock signal line 101 (a first clock signal line) and a data signal line 102 (a first data signal line) through a clock terminal (first clock terminal) and a data terminal (first data terminal), respectively. The clock signal line 101 and data signal line 102 transmit a clock signal (first clock signal) and a data signal (first data signal), respectively, in serial communication to the serial communication slave device 200.

The serial communication master device 100 is also connected with a clock signal line 201 (a second clock signal line) and a data signal line 202 (a second data signal line through a clock terminal (second clock terminal) and a data terminal (second data terminal), respectively. The clock signal line 201 and data signal line 202 transmit a clock signal (second clock signal) and a data signal (second data signal), respectively, in serial communication from the serial communication slave device 200.

Data on the data signal line 102 is in synchronism with a clock on the clock signal line 101. Data on the data signal line 202 is in synchronism with a clock on the clock signal line 201. Note that a case in which one line is used for one way will be described here. This embodiment, however, is applicable to a case in which a plurality of data signal lines 102 and a plurality of data signal lines 202 are used.

Figure 3:
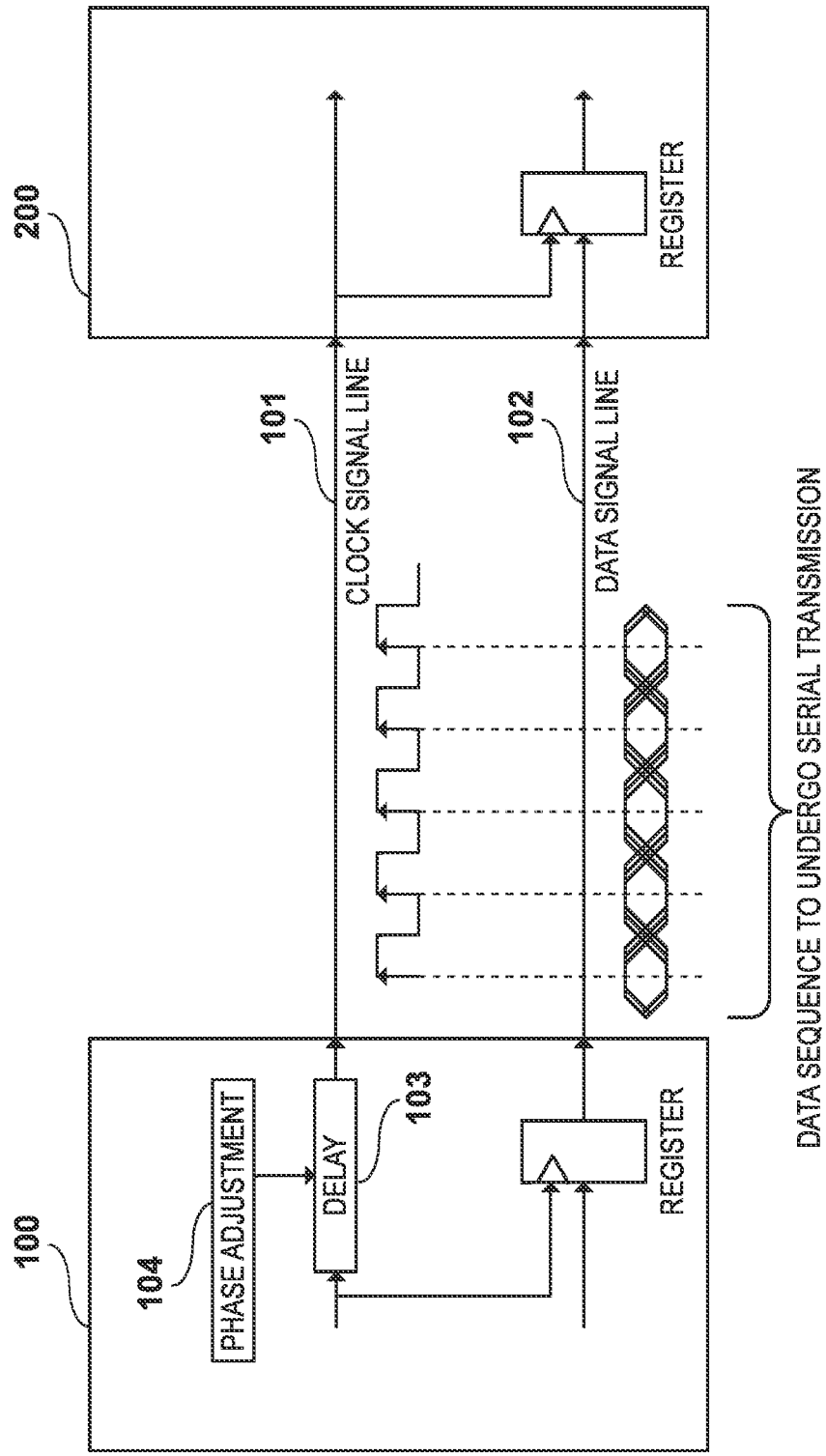
FIG. 3 is a view exemplarily showing signals transmitted through a clock signal line and a data signal line.

FIG. 3 is a view exemplarily showing signals transmitted through the clock signal line and data signal line. FIG. 3 shows the arrangement of the clock signal line and data signal line in a center alignment method. Note that the center alignment method indicates a method of arranging the signal lines so that the rising edge of a clock is located at the midpoint between adjacent transition points of a data signal. The embodiment is also applicable to any other methods such as an edge alignment method of aligning the rising edge of a clock with a transition point of a data signal, as a matter of course.

Note that in recent high-speed operations, the interval of a clock signal is shortening and it is becoming difficult to ensure a design margin due to the wiring on a printed board or variations in processes within an integrated circuit. To deal with this problem, as shown in FIG. 3, the serial communication master device 100 includes a delay element 103 for delaying the clock signal line, and a phase adjustment mechanism 104 for giving an instruction to adjust the phases of the clock and data to the delay element. An adjustment operation is performed after connection confirmation for each transmission device so that the rising edge of the clock is located at the midpoint between transitions of the data signal. Note that although FIG. 3 shows an SDR (Single Data Rate) method which uses only the rising edge of the clock, the embodiment is applicable to a DDR (Double Data Rate) method which uses the rising edge and the falling edge of the clock.

Figure 4:
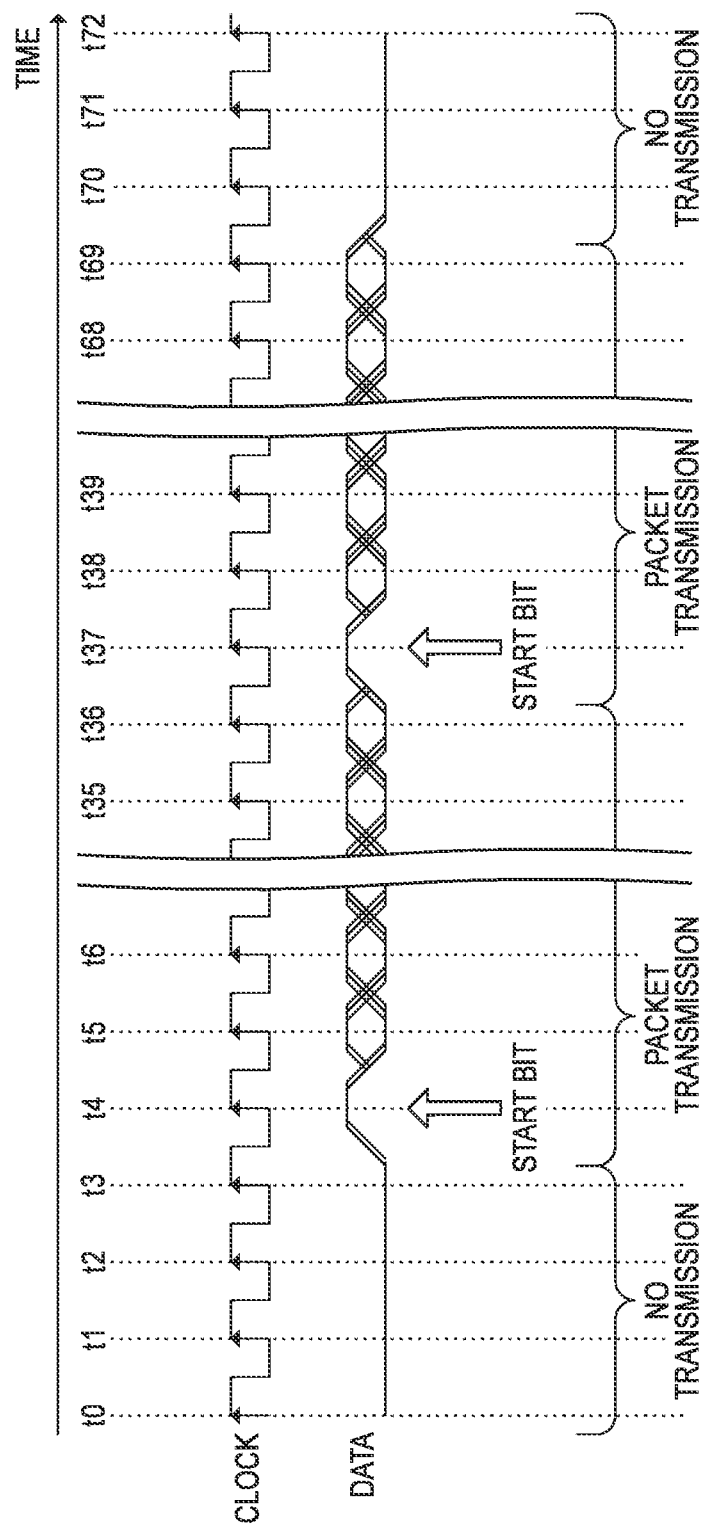
FIG. 4 is a timing chart exemplarily showing packet transmission in serial communication.

FIG. 4 is a timing chart exemplarily showing packet transmission in serial communication. FIG. 4 shows a case in which 32 bits are transmitted as one packet in serial communication.

During a time t0 to t3, the logical value of the data signal line is "0" (the signal line has not been asserted, in which a signal level is negative, and is a first signal level), and the serial communication master device 100 and serial communication slave device 200 recognize that no transmission operation is executed. At a time t4, by setting the logical value of the data signal line to "1" as a start bit indicating start of transmission (by setting the signal line in an assertion state, in which the signal level is active, and is a second signal level), the devices 100 and 200 recognize start of packet transmission. 32 cycles after this operation indicate an operation of transmitting a packet (32-bit data). Then, at a time t37, the logical value of the data signal line is set to "1" as a start bit (that is, the signal line is asserted) to transmit a second packet. After the transmission operation ends (at a time t70 and thereafter), the logical value of the data signal line is set to "0" (that is, the assertion is canceled), and then the serial communication master device 100 and serial communication slave device 200 recognize again that no transmission operation is performed.

Figure 5:
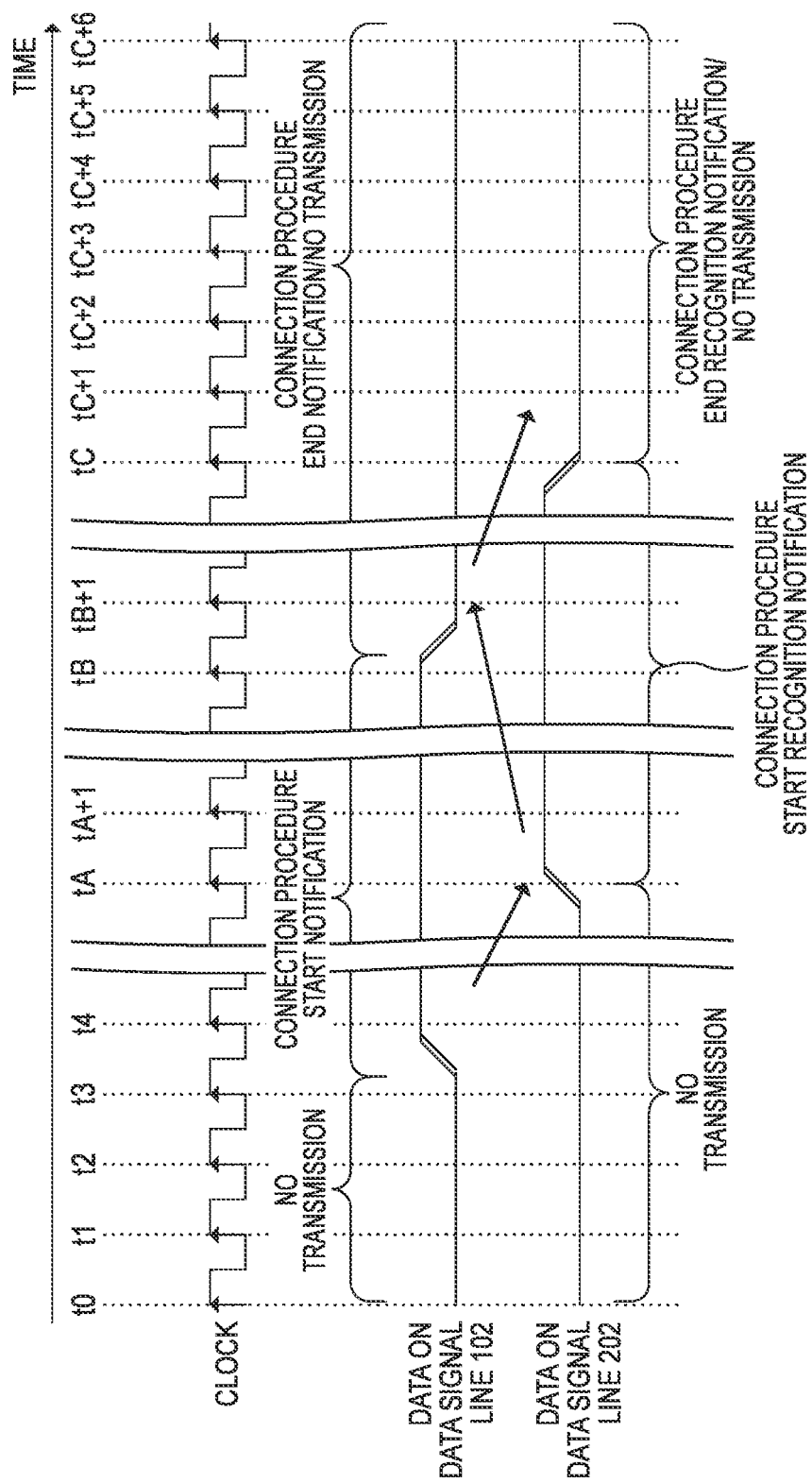
FIG. 5 is a timing chart exemplarily showing a waveform on each signal line in an initialization sequence for connection confirmation in the serial communication system.

FIG. 5 is a timing chart exemplarily showing a waveform on each signal line in an initialization sequence for connection confirmation. At start of the initialization sequence which is executed after power-on/reset cancellation, a phase shift may occur, thereby disabling correct exchange of data. At this point, it is impossible to identify the state of a partner device (integrated circuit), and there is no way of identifying an appropriate timing of starting a connection procedure.

To solve this problem, by continuously driving the data signal line with the same logical value for a period of time longer than the cycle of a corresponding clock signal, virtual full-handshake connection is done. More specifically, a packet in which all bits are "0" and a packet in which all bits are "1" are bi-directionally transmitted/received as pseudo control signals on the data line. By driving the data signal line for a period of time longer than the cycle of a corresponding clock signal, it is possible to perform connection confirmation without the influence of a phase shift or connection start timing.

By virtual full-handshake connection, the serial communication master device 100 can recognize (make connection decision) that it is physically connected with the serial communication slave device 200. The serial communication master device 100 can also recognize that the serial communication slave device 200 is in a communicable state after power processing and reset processing. Once the device can perform connection confirmation, it can transit to an appropriate communication state by performing phase adjustment.

If the serial communication slave device 200 is in a state before power-on processing, during power-on processing, or during reset processing, the value of the data signal line 202 in FIG. 5 remains "0". When the serial communication slave device 200 sets the value of the data signal line 202 to "1" after the power processing and reset processing end, the serial communication master device 100 can identify that the serial communication slave device 200 has transited to a communicable state.

As described above, since the same logical value ("0" or "1") is maintained on the data signal line for a relatively long time, it is possible to prevent loss of data due to a phase shift or the like. Then, if there is no response from the partner device on the data signal line for a given period of time after start of a connection procedure, each of the serial communication master device 100 and serial communication slave device 200 can determine that a failure such as an unconnected error or disconnection has occurred.

Figure 6:
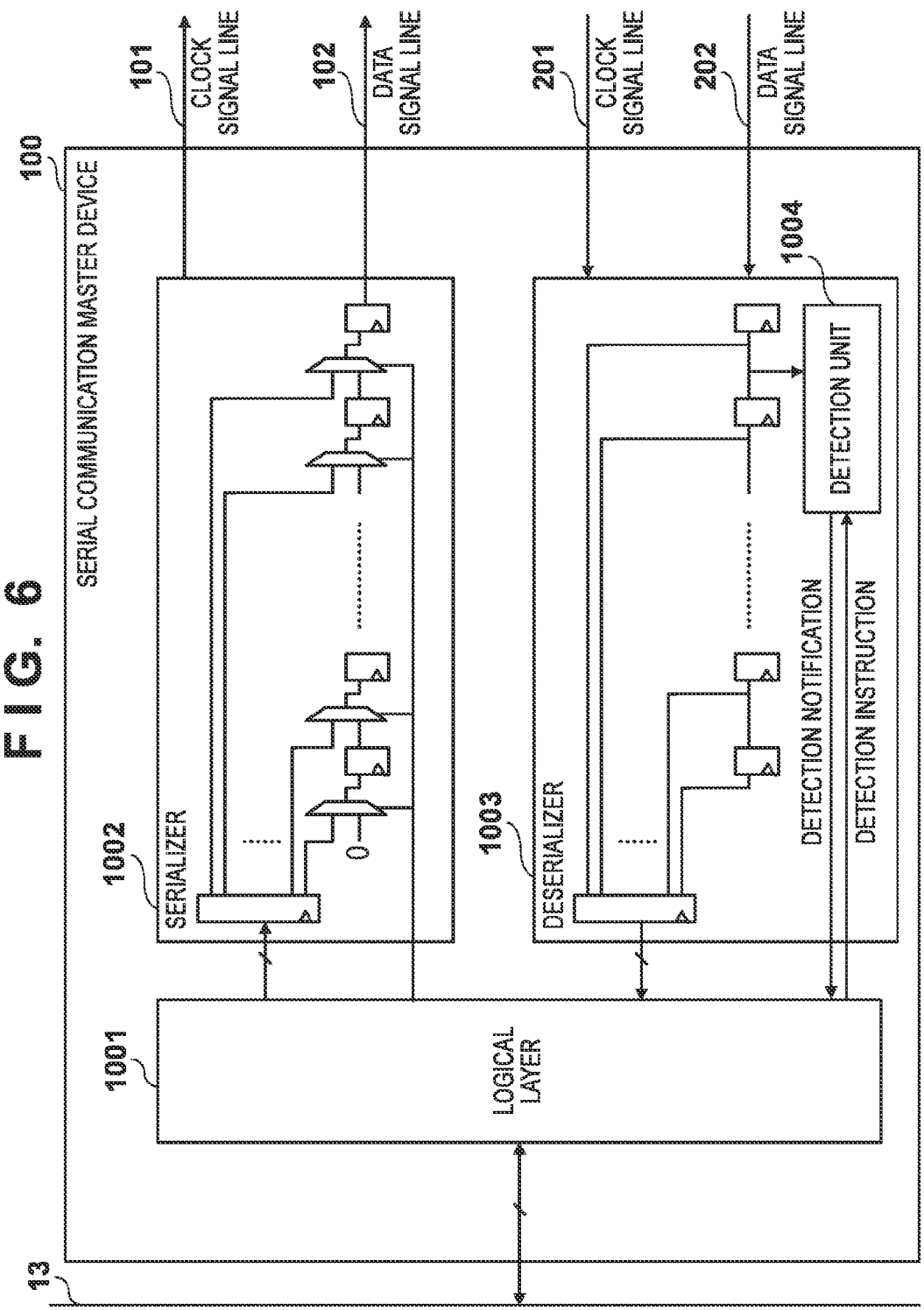
FIG. 6 is a view exemplarily showing the internal arrangement of a serial communication master device.

FIG. 6 is a view exemplarily showing the internal arrangement of the serial communication master device 100. The serial communication master device 100 includes a logical layer 1001, a serializer 1002, a deserializer 1003, and a detection unit 1004. Note that as described above, the serial communication master device 100 performs both transmission and reception operations.

The logical layer 1001 is connected with the first bus 13, serializer 1002, deserializer 1003, and detection unit 1004. In response to a detection notification from the detection unit 1004, the logical layer 1001 transmits a packet to the serializer 1002 and instructs the serializer 1002 to start serialization. Furthermore, the logical layer 1001 is configured to analyze the packet acquired from the deserializer 1003, and send reception data to the first bus 13.

The serializer 1002 is connected with the logical layer 1001 and data signal line 102, and converts a parallel signal acquired from the logical layer 1001 into a serial signal to output it to the data signal line 102. Note that the serializer 1002 is configured to execute serialization processing in synchronism with a clock from the logical layer 1001.

The detection unit 1004 samples a logical value ("0" or "1") received by the data signal line 202, and decides whether the same logical values have continued a predetermined number of times or more. Upon receiving a reception data detection instruction from the logical layer 1001, the detection unit 1004 starts to sample a signal on the data signal line 202 based on the clock received from the clock signal line 201. Note that the unit 1004 may be configured to sample a signal using a clock source included in the serial communication master device 100. If the unit 1004 decides that the same logical values have continued a predetermined number of times or more, it transmits a detection notification to the logical layer 1001. Note that the reason why the detection unit 1004 makes the above decision instead of the logical layer 1001 is because, when logical values "0"s continue, it is impossible to set a start bit (logical value "1") and thus the deserializer 1003 cannot extract a packet.

The deserializer 1003 accepts an input of the data of the serial signal from the data signal line 202. The deserializer 1003 converts the input serial signal into a parallel signal with M bits (M is an integer of 2 or larger), and outputs it to the logical layer 1001.

Figure 7:
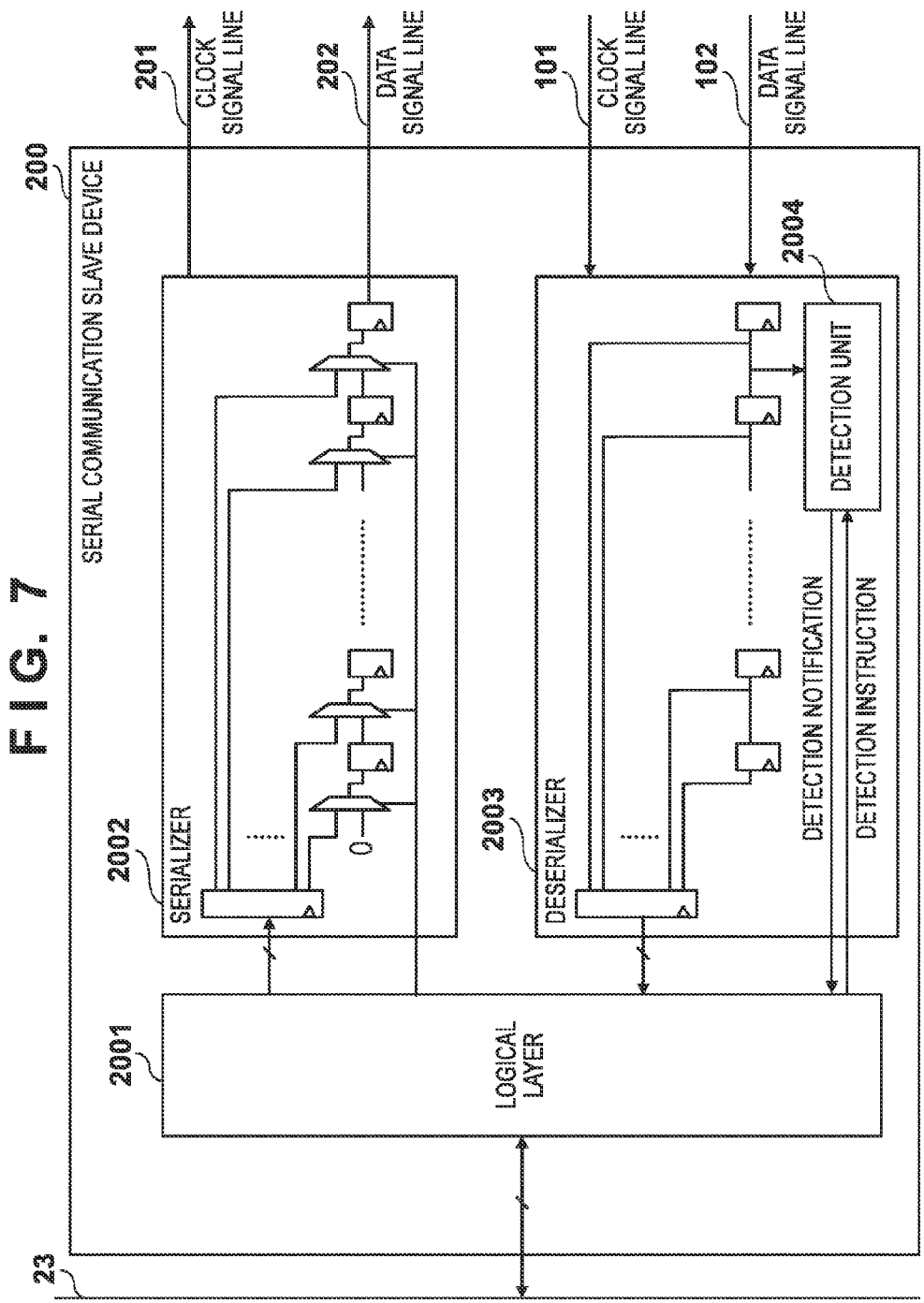
FIG. 7 is a view exemplarily showing the internal arrangement of a serial communication slave device.

FIG. 7 is a view exemplarily showing the internal arrangement of the serial communication slave device 200. The serial communication slave device 200 includes a logical layer 2001, a serializer 2002, a deserializer 2003, and a detection unit 2004. Note that as described above, the serial communication slave device 200 also performs both transmission and reception operations. The operation of each unit within the serial communication slave device 200 is the same as that in each corresponding unit of the serial communication master device 100, and a description thereof will be omitted. For example, the deserializer 2003 converts the input serial signal into a parallel signal with N bits (N is an integer of 2 or larger), and outputs it to the logical layer 2001.

<Operation of Device>

Figure 8:
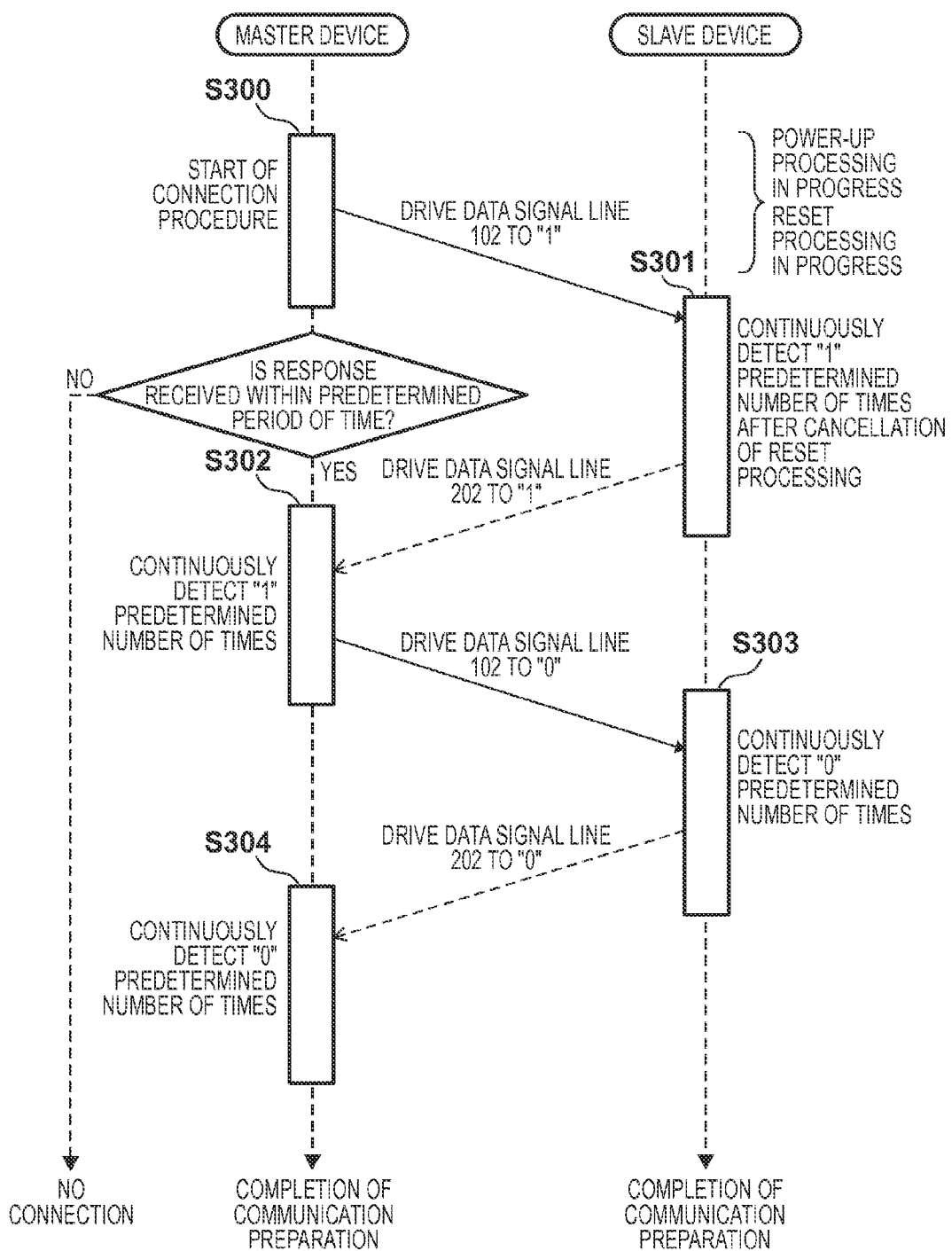
FIG. 8 is an initialization sequence chart for connection confirmation in the serial communication system.

FIG. 8 is a sequence chart showing initialization of communication for connection confirmation in the serial communication system. Note that FIG. 8 is a sequence chart obtained by rewriting the timing chart of FIG. 5. In the initialization processing, it is decided whether the serial communication master device 100 and serial communication slave device 200 can communicate with each other to establish serial communication between the devices.

In step S300, the serial communication master device 100 starts to check the connection state to establish serial communication with the serial communication slave device 200. More specifically, the logical value of the data signal line 102 is changed from the initial value "0" to "1". That is, a partner device is notified of a change (start of a connection procedure) in state of the serial communication master device 100 by forcibly changing the logical value of the data signal line 102 to "1" without checking, in advance, the state of the serial communication slave device 200. For example, the device 100 is configured to directly drive the data signal line 102 to "1" (a first driving unit). Note that the logical layer 1001 continuously generates a packet formed by a plurality of bits having the same logical value ("1"), and sends it to the serializer 1002. This enables to drive the data signal line 102 to "1" without any additional circuit.

In step S301, the serial communication slave device 200 enters an operable state upon completion of power-on processing and reset processing, and then starts to detect the logical value of the data signal line 102. In this example, the logical layer 2001 transmits a reception data detection instruction to the detection unit 2004, and the detection unit 2004 analyzes logical values with one packet length (32 bits in this example) obtained by sampling a signal on the data signal line 102. If the unit 2004 detects that all the logical values are "1" (a second decision unit), it decides that there is a partner device which has transited to a connection procedure start state, and notifies the logical layer 2001 of it.

If the serial communication slave device 200 decides that there is a partner device which has transited to a connection procedure start state, it changes the logical value of the data signal line 202 from the initial value "0" to "1". That is, a partner device is notified of a change (start of a connection procedure) in state of the serial communication slave device 200 by forcibly changing the logical value of the data signal line 202 to "1" upon presence confirmation of the partner device which has transited to a connection procedure start state. For example, the device 200 is configured to directly drive the data signal line 202 to "1" (a second driving unit). Note that the logical layer 2001 continuously generates a packet formed by a plurality of bits having the same logical value ("1"), and sends it to the serializer 2002.

After the connection procedure start processing (step S300), the serial communication master device 100 starts to detect the logical value of the data signal line 202 in step S302. In this example, the logical layer 1001 transmits a reception data detection instruction to the detection unit 1004, and the detection unit 1004 analyzes logical values (32 bits in this example) obtained by sampling a signal on the data signal line 202. If the unit 1004 detects that all the logical values are "1" (a first decision unit), it decides that there is a partner device which has transited to a connection procedure start state, and notifies the logical layer 1001 of it.

If the serial communication master device 100 decides that there is a partner device which has transited to a connection procedure start state, it changes the logical value of the data signal line 102 from the initial value "1" to "0". The device 100 may be configured to directly drive the data signal line 102 to "0". Assume, however, that the logical layer 1001 continuously generates a packet in which all logical values are "0", and outputs it to the serializer 1002. Note that the device 100 may be configured so that the logical value of the data signal line 102 remains the initial value "0" by suppressing generation of a packet in the logical layer 1001.

After the connection procedure start processing (step S301), the serial communication slave device 200 starts to detect the logical value of the data signal line 102 in step S303. In this example, the logical layer 2001 transmits a reception data detection instruction to the detection unit 2004, and the detection unit 2004 analyzes logical values with one packet length (32 bits in this example) obtained by sampling a signal on the data signal line 102.

If the detection unit 2004 detects that all the logical values are "0", it decides completion of the connection procedure, and notifies the logical layer 2001 of it (a second state decision unit). Furthermore, the unit 2004 changes the logical value of the data signal line 202 from "1" to "0" (a second cancellation unit).

After changing the logical value of the data signal line 102 from the initial value "1" to "0" (step S302), the serial communication master device 100 starts to detect the logical value of the data signal line 202 in step S304. In this example, the logical layer 1001 transmits a reception data detection instruction to the detection unit 1004, and the detection unit 1004 analyzes logical values with one packet length (32 bits in this example) obtained by sampling a signal on the data signal line 202.

If the detection unit 1004 detects that all the logical values are "0", it decides completion of the connection procedure, and notifies the logical layer 1001 of it (a first state decision unit). Furthermore, the unit 1004 changes the logical value of the data signal line 102 from "1" to "0" (a first cancellation unit).

If the serial communication master device 100 cannot confirm within a predetermined period of time after completion of the processing in step S300 that the logical value of the data signal line 202 has changed to "1", it decides that the partner device is not connected.

<Operation Sequence Upon Reoccurrence of Reset Processing>

Figure 9:
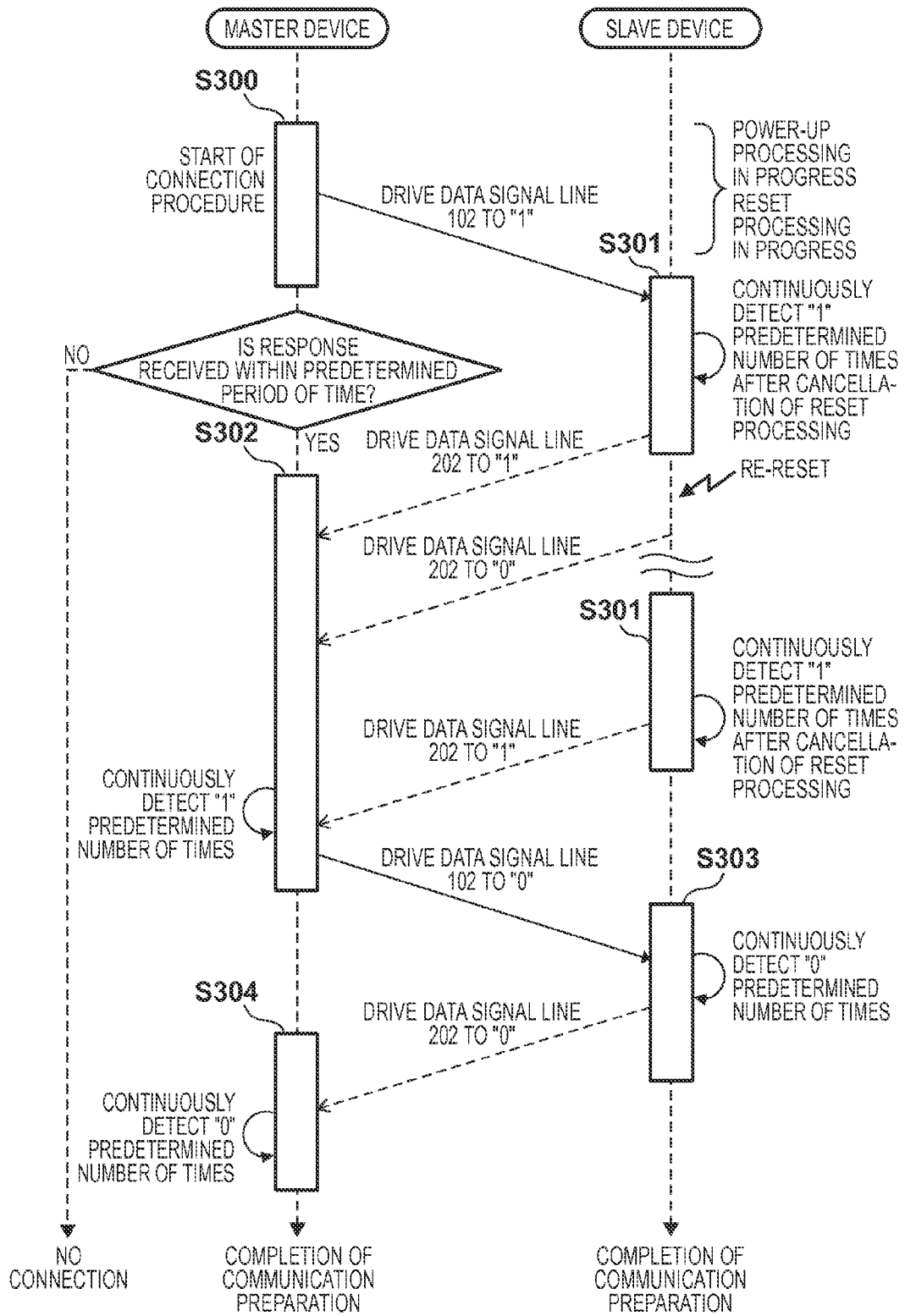
FIG. 9 is an initialization sequence chart for connection confirmation (case 1 of reoccurrence of reset processing of the slave device)
Figure 10:
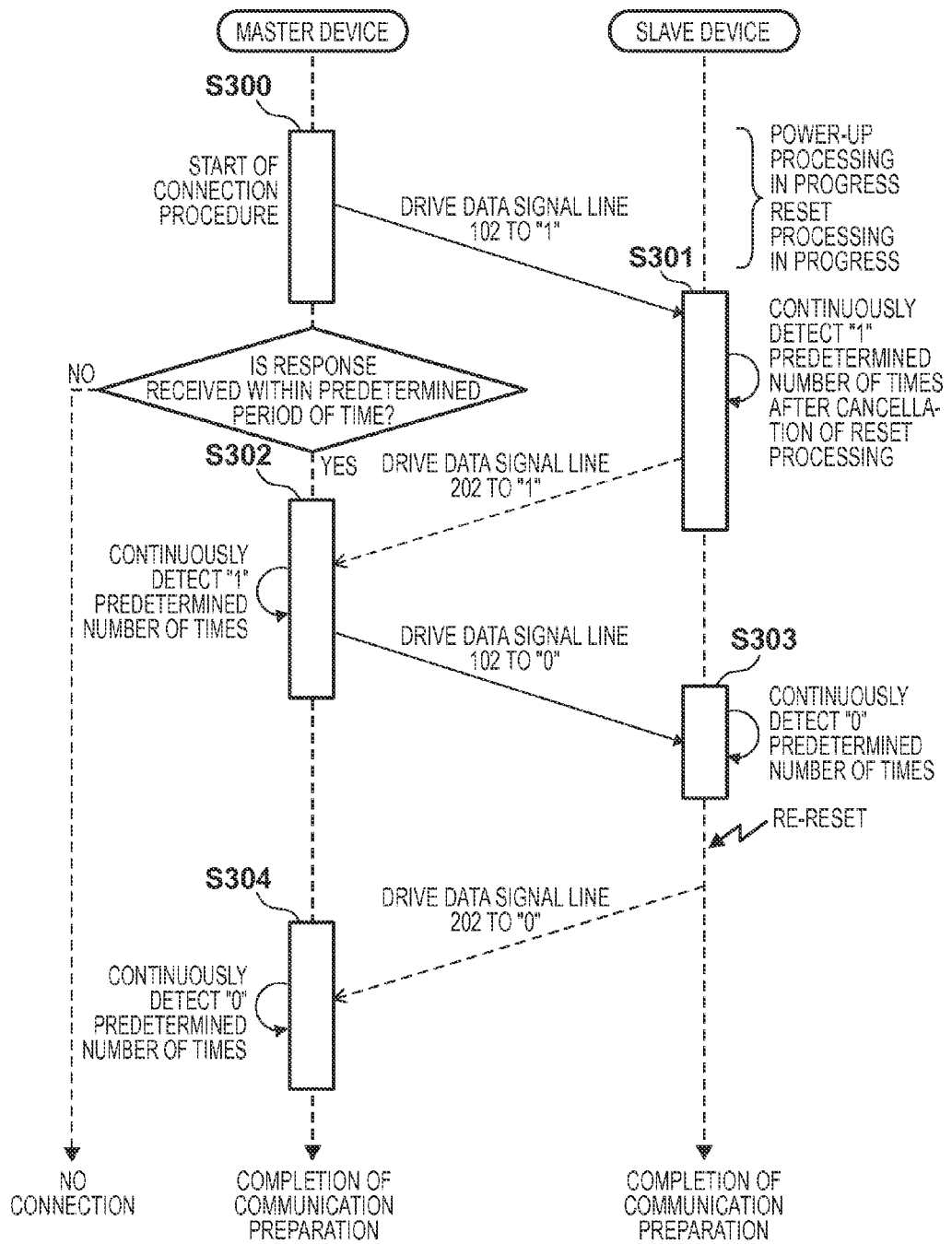
FIG. 10 is an initialization sequence chart for connection confirmation (case 2 of reoccurrence of reset processing of the slave device)
Figure 11:
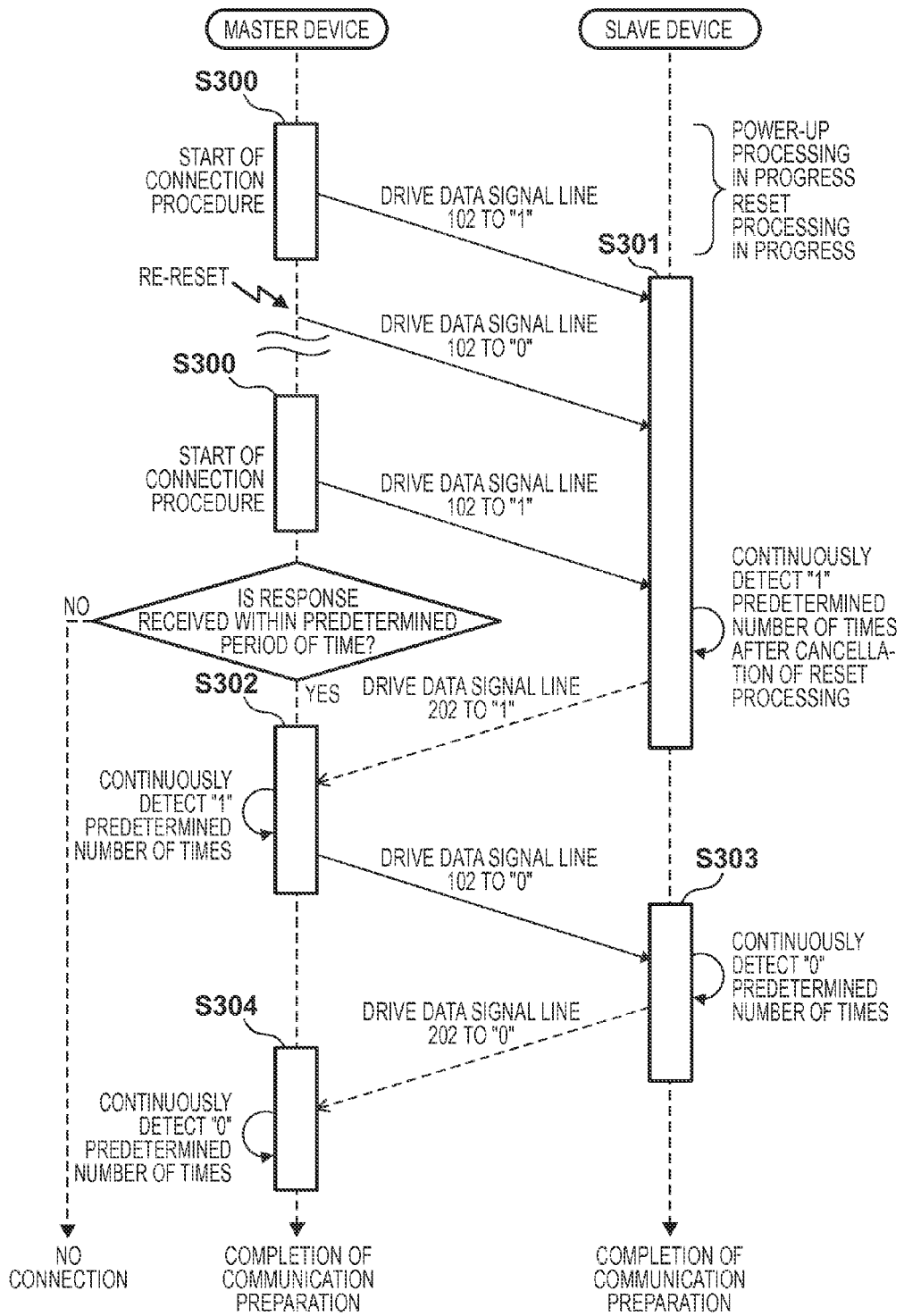
FIG. 11 is an initialization sequence chart for connection confirmation (case 1 of reoccurrence of reset processing of the master device)
Figure 12:
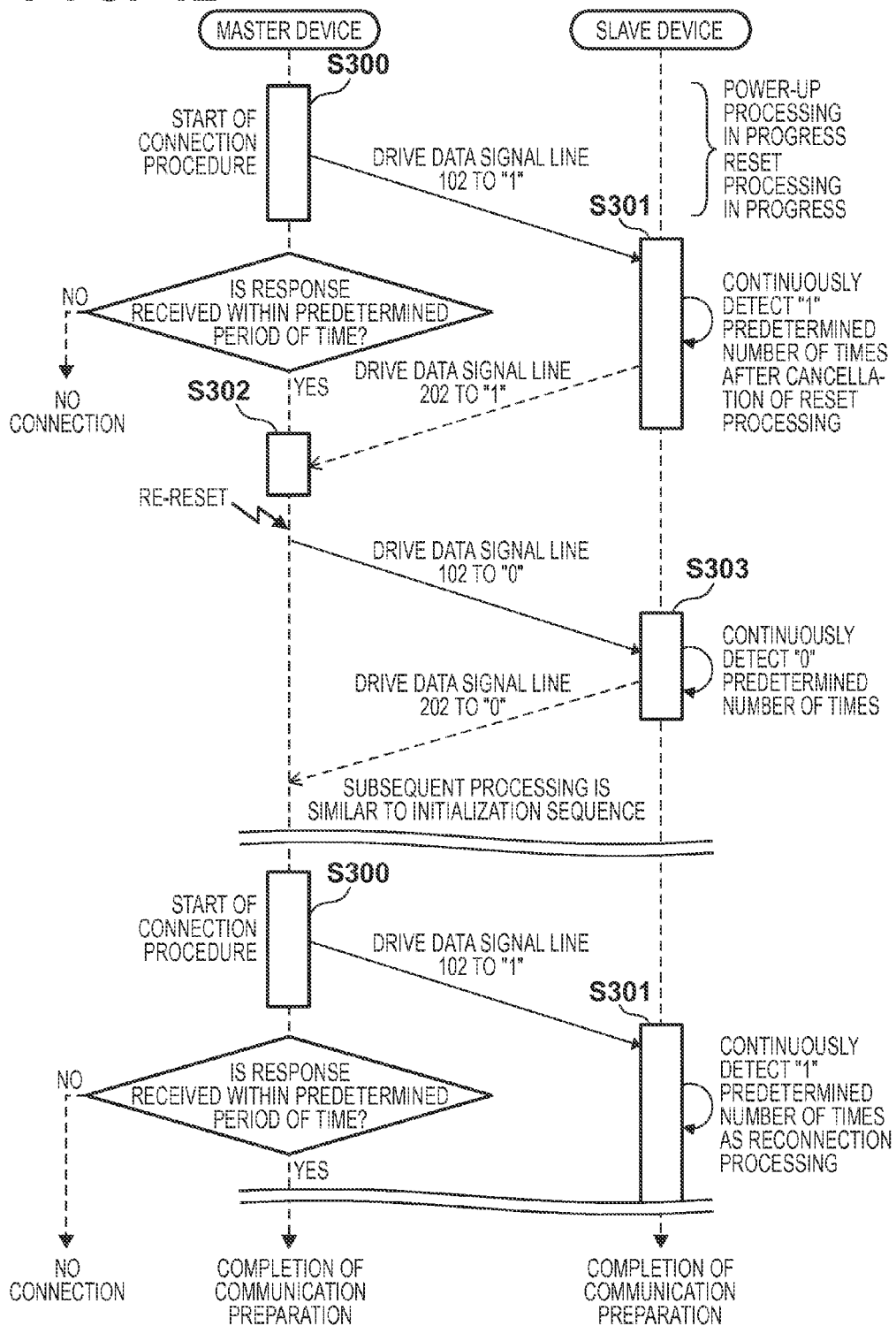
FIG. 12 is an initialization sequence chart for connection confirmation (case 2 of reoccurrence of reset processing of the master device)

FIGS. 9 and 10 are initialization sequence charts when reset processing reoccurs in the serial communication slave device 200. FIGS. 11 and 12 are initialization sequence charts when reset processing reoccurs in the serial communication master device 100. Note that power-off/power-on processing can be considered similarly to reset processing. Note that an operation in each step is similar to that in each step described with reference to FIG. 8.

It is understood from the respective drawings that even if reset processing occurs during initialization processing, it is only necessary to simply re-execute the initialization sequence in the serial communication master device 100 and serial communication slave device 200. That is, since reoccurrence of reset processing indicates an operation of changing the logical value of the data signal line 102 or 202 to "0", it is possible to re-execute the initialization sequence without the need to change processing contents in each step of the initialization sequence. It is characterized that the state of the partner device has little influence on the above-described initialization sequence in connection confirmation.

As described above, according to the present embodiment, it is possible to realize virtual full-handshake connection between the serial communication master device 100 and the serial communication slave device 200. In spite of high-speed serial communication (that is, a high clock), the logical value of the data signal line is changed on a timescale longer than the cycle of the clock signal. It is, therefore, possible to perform connection confirmation without the influence of a phase shift or connection start timing.

Note that although serial communication between integrated circuits has been explained in the above description, the embodiment is also applicable to serial communication within one integrated circuit. Furthermore, the embodiment is applicable to serial communication between vertically adjacent integrated circuits using a number of TSVs (Through Silicon Vias) passing through a silicon substrate.

Another embodiment in which the logical layer 1001 decides that the same logical values have continued on the data signal line 202 a predetermined number of times or more will now be described. As described above, when logical values "0"s continue, it is impossible to set a start bit (logical value "1") and thus the deserializer 1003 cannot extract a packet. To deal with this problem, a case in which a polarity switching unit 1005 is arranged between the data signal line 202 and the deserializer 1003 to generate a pseudo start bit will be described below.

<Arrangement of Device>

Figure 13:
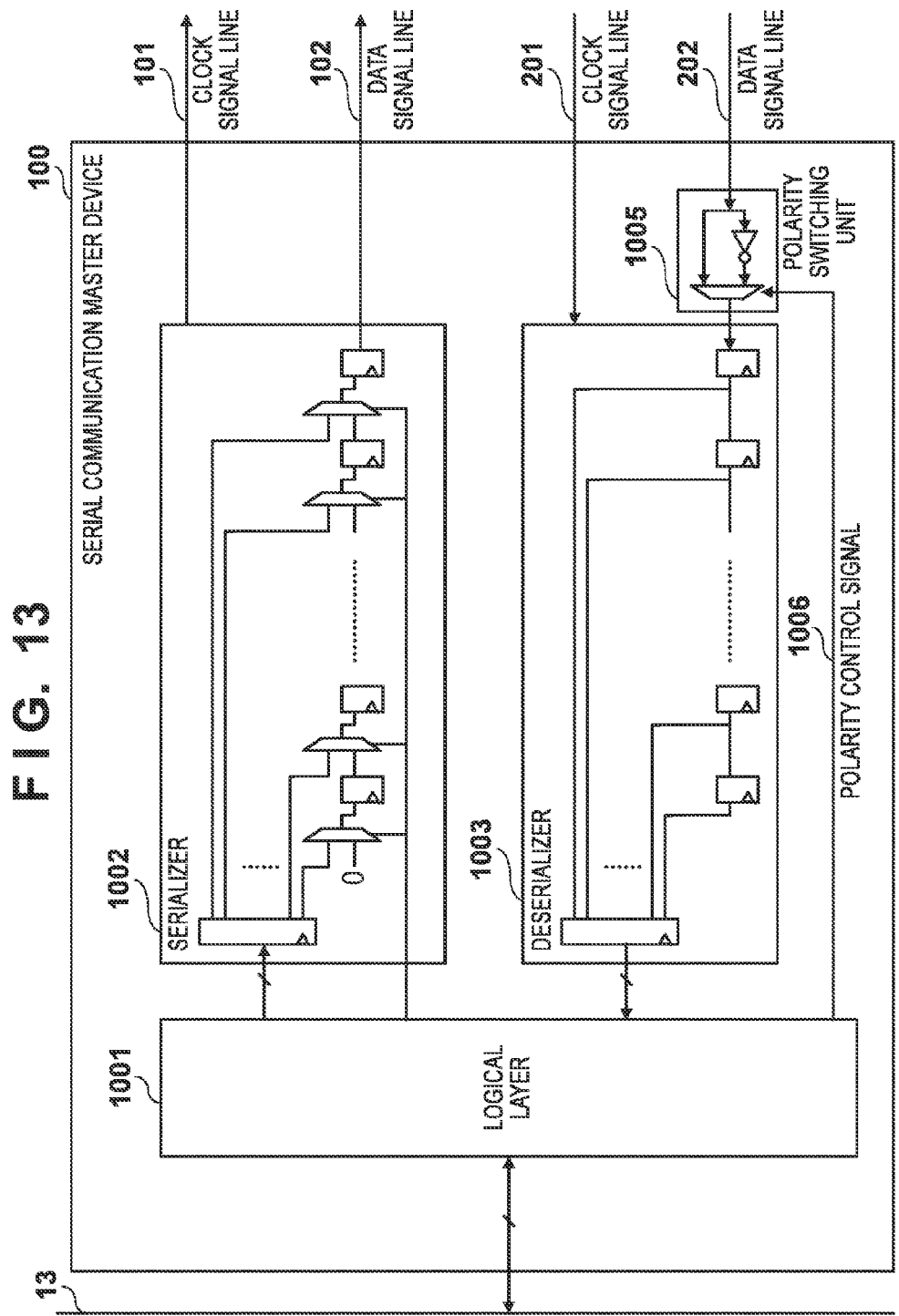
FIG. 13 is a view exemplarily showing the internal arrangement of a serial communication master device.

FIG. 13 is a view exemplarily showing the internal arrangement of a serial communication master device 100. The serial communication master device 100 includes a logical layer 1001, a serializer 1002, a deserializer 1003, and a polarity switching unit 1005. The serial communication master device 100 performs both transmission and reception operations.

The logical layer 1001 is connected with a first bus 13, the serializer 1002, and the deserializer 1003. The logical layer 1001 transmits a packet to the serializer 1002, and instructs the serializer 1002 to start serialization. Furthermore, the logical layer 1001 is configured to analyze the packet acquired from the deserializer 1003, and send reception data to the first bus 13. The logical layer 1001 decides whether the packet acquired from the deserializer 1003 is formed by identical logical values.

The serializer 1002 is connected with the logical layer 1001 and a data signal line 102, and converts a parallel signal acquired from the logical layer 1001 to output it to the data signal line 102. Note that the serializer 1002 is configured to execute serialization processing in synchronism with a clock from the logical layer 1001.

The deserializer 1003 accepts an input of the data of the serial signal from a data signal line 202. If the deserializer 1003 detects a start bit, it converts the input serial signal into a parallel signal with M bits (M is an integer of 2 or larger), and outputs it to the logical layer 1001.

The polarity switching unit 1005 controls to switch the polarity of the signal received from the data signal line 202. More specifically, the unit 1005 switches between an operation of outputting the received signal intact to the deserializer 1003 and an operation of inverting the polarity of the received signal to output it to the deserializer 1003, based on a polarity control signal 1006 from the logical layer 1001.

Figure 14:
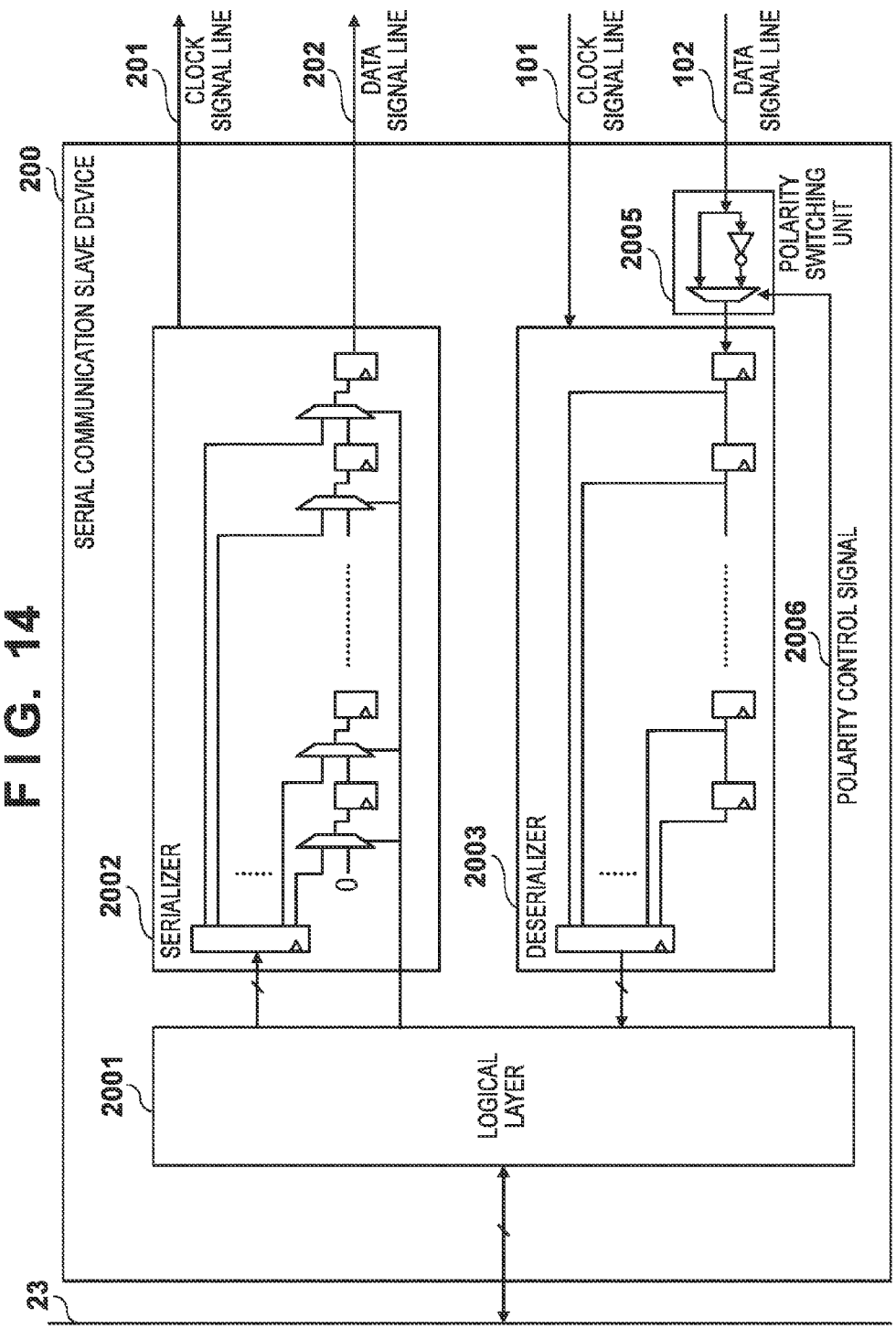
FIG. 14 is a view exemplarily showing the internal arrangement of a serial communication slave device.

FIG. 14 is a view exemplarily showing the internal arrangement of a serial communication slave device 200. The serial communication slave device 200 includes a logical layer 2001, a serializer 2002, a deserializer 2003, and a polarity switching unit 2005. Note that as described above, the serial communication slave device 200 also performs both transmission and reception operations. The operation of each unit within the serial communication slave device 200 is the same as that of each corresponding unit of the serial communication master device 100, and a description thereof will be omitted. For example, if the deserializer 2003 detects a start bit, it converts the input serial signal into a parallel signal with N bits (N is an integer of 2 or larger), and outputs it to the logical layer 2001.

<Operation of Device>

An initialization operation between the serial communication master device 100 and the serial communication slave device 200 is different from the above-described embodiment in terms of the following points.

In step S301, the logical layer 2001 transmits a polarity control signal 2006 to the polarity switching unit 2005 to control to invert the polarity of a signal from the data signal line 102 while changing the logical value of the data signal line 202 from the initial value "0" to "1". The inversion control operation causes the logical layer 2001 to recognize the logical values "0" and "1" of the data signal line 102 as logical values "1" and "0", respectively.

In step S302, the logical layer 1001 transmits the polarity control signal 1006 to the polarity switching unit 1005 to control to invert the polarity of a signal from the data signal line 202 while changing the logical value of the data signal line 102 from the initial value "1" to "0". The inversion control operation causes the logical layer 1001 to recognize the logical values "0" and "1" of the data signal line 202 as logical values "1" and "0", respectively.

In step S303, if the logical layer 2001 detects that all the logical values are "1" (that is, "0" on the data signal line 102), it decides completion of the connection procedure. Furthermore, the logical layer 2001 transmits the polarity control signal 2006 to the polarity switching unit 2005 to control to cancel the inversion of the polarity of the signal from the data signal line 102 while changing the logical value of the data signal line 202 from "1" to "0". After that, the serial communication slave device 200 transits to a communicable state.

In step S304, if the logical layer 1001 detects that all the logical values are "1" (that is, "0" on the data signal line 202), it decides completion of the connection procedure. Furthermore, the logical layer 1001 transmits the polarity control signal 1006 to the polarity switching unit 1005 to control to cancel the inversion of the polarity of the signal from the data signal line 202 while changing the logical value of the data signal line 102 from "1" to "0". After that, the serial communication master device 100 transits to a communicable state.

That is, the deserializer detects a change from "1" to "0" on the data signal line as a change from "0" to "1" by inverting the polarity of a signal from the data signal line. That is, the deserializer can extract serial data using the first logical value "1" as a pseudo start bit.

As described above, according to the embodiment, it is possible to realize virtual full-handshake connection between the serial communication master device 100 and the serial communication slave device 200. After the deserializer converts data into parallel data, it is possible to decide a logical value, thereby allowing decision at a low clock. Note that although a high signal level indicates an active state (positive logic) in the above explanation, the present disclosure is characterized by changing the signal level, and is applicable to a case in which low level indicates an active state (negative logic), as long as the master and slave support it.

Other Embodiments

Aspects of the present embodiment can also be realized by a computer of a system or apparatus (or devices such as a CPU or MPU) that reads out and executes a program recorded on a memory device to perform the functions of the above-described embodiment(s), and by a method, the steps of which are performed by a computer of a system or apparatus by, for example, reading out and executing a program recorded on a memory device to perform the functions of the above-described embodiment(s). For this purpose, the program is provided to the computer for example via a network or from a recording medium of various types serving as the memory device (e.g., computer-readable storage medium).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2012-053680, filed Mar. 9, 2012 and 2012-053681, filed Mar. 9, 2012, which are hereby incorporated by reference herein in their entirety.

What is claimed is:

1. An information processing apparatus including a master and a slave which is connected with said master by a plurality of signal lines to be able to make serial communication therewith, wherein
said master and said slave are configured to perform a handshake when said master changes a signal level of a first data signal line included in the plurality of signal lines from a first signal level to a second signal level for a period of time longer than a cycle of a clock transmitted to said slave through a clock signal line of the plurality of signal lines, and said slave changes, based on the fact that said master has changed the signal level of the first data signal line to the second signal level, a signal level of a second data signal line included in the plurality of signal lines from the first signal level to the second signal level for a period of time longer than a cycle of a clock transmitted to said master through a clock signal line of the plurality of signal line.

2. The apparatus according to claim 1, wherein
said master and said slave are further configured to perform a handshake when said master changes, based on the fact that said slave has changed the signal level of the second data signal line to the second signal level, the signal level of the first data signal line to the first signal level for a period of time longer than the cycle of the clock transmitted to said slave, and said slave changes, based on the fact that said master has changed the signal level of the first data signal line to the first signal level, the signal level of the second data signal line to the first signal level for a period of time longer than the cycle of the clock transmitted to said master.

3. The apparatus according to claim 1, wherein
said master changes the signal level of the first data signal line from the first signal level to the second signal level and keeps the second signal level for a period of time longer than a cycle of the clock, and said slave changes the signal level of the second data signal line from the first signal level to the second signal level and keeps the second signal level for a period of time longer than a cycle of the clock.

4. A serial communication system including a master apparatus and a slave apparatus, wherein
said master apparatus and said slave apparatus are connected by
a first clock signal line configured to transmit a first clock signal from said master apparatus to said slave apparatus,
a first data signal line configured to transmit a first data signal from said master apparatus to said slave apparatus,
a second clock signal line configured to transmit a second clock signal from said slave apparatus to said master apparatus, and
a second data signal line configured to transmit a second data signal from said slave apparatus to said master apparatus,
said master apparatus comprises
a first driving unit configured to control to assert the first data signal line for a period of time longer than at least a cycle of the first clock signal,
a first decision unit configured to decide whether the second data signal line has been asserted,
a first cancellation unit configured to control to cancel, when said first decision unit detects that the second data signal line has been asserted for a period of time longer than at least a cycle of the second clock signal after said first driving unit asserted the first data signal line, the assertion of the first data signal line, and
a first state decision unit configured to decide, when said first decision unit detects that the second data signal line has not been asserted for a period of time longer than at least the cycle of the second clock signal after said first cancellation unit canceled the assertion of the first data signal line, that said slave apparatus is in a communicable state, and
said slave apparatus comprises
a second decision unit configured to decide whether the first data signal line has been asserted,
a second driving unit configured to control to assert, when said second decision unit detects that the first data signal line has been asserted for a period of time longer than at least the cycle of the first clock signal, the second data signal line for a period of time longer than at least the cycle of the second clock signal, and
a second state decision unit configured to control to cancel, when said second decision unit detects that the first data signal line has not been asserted for a period of time longer than at least the cycle of the first clock signal after said second driving unit asserted the second data signal line, the assertion of the second data signal line while deciding that said master apparatus is in a communicable state.

5. The system according to claim 4, wherein
said first decision unit is configured to sample a signal on the second data signal line according to the second clock signal, and decide whether the sampled signal has been continuously asserted a predetermined number of times, and
said second decision unit is configured to sample a signal on the first data signal line according to the first clock signal, and decide whether the signal has been continuously asserted a predetermined number of times.

6. The system according to claim 4, wherein
said first decision unit is configured to sample a signal on the second data signal line according to the second clock signal, convert a serial signal obtained by the sampling operation into a parallel signal with M bits (M is an integer of 2 or larger), and decide whether all the M bits of the converted parallel signal have been asserted, and
said second decision unit is configured to sample a signal on the first data signal line according to the first clock signal, convert a serial signal obtained by the sampling operation into a parallel signal with N bits (N is an integer of 2 or larger), and decide whether all the N bits of the converted parallel signal have been asserted.

7. A method of initialization of communication for an information processing apparatus including a master and a slave which is connected with the master by a plurality of signal lines to be able to make serial communication therewith, the method comprising:
causing the master to change a signal level of a first data signal line included in the plurality of signal lines from a first signal level to a second signal level for a period of time longer than a cycle of a clock transmitted to the slave through a clock signal line of the plurality of signal lines, and
causing the slave to change, based on the fact that the master has changed the signal level of the first data signal line to the second signal level, a signal level of a second data signal line included in the plurality of signal lines from the first signal level to the second signal level for a period of time longer than a cycle of a clock transmitted to the master through a clock signal line of the plurality of signal lines.

8. The method according to claim 7, further comprising:

causing the master to change, based on the fact that the slave has changed the signal level of the second data signal line to the second signal level, the signal level of the first data signal line to the first signal level for a period of time longer than the cycle of the clock transmitted to the slave, and causing the slave to change, based on the fact that the master has changed the signal level of the first data signal line to the first signal level, the signal level of the second data signal line to the first signal level for a period of time longer than the cycle of the clock transmitted to the master.

9. A method of initialization of communication for a serial communication system including a master apparatus and a slave apparatus, wherein the master apparatus and the slave apparatus are connected by a first clock signal line configured to transmit a first clock signal from the master apparatus to the slave apparatus, a first data signal line configured to transmit a first data signal from the master apparatus to the slave apparatus, a second clock signal line configured to transmit a second clock signal from the slave apparatus to the master apparatus, and a second data signal line configured to transmit a second data signal from the slave apparatus to the master apparatus, the method comprises controlling the master apparatus to assert the first data signal line for a period of time longer than at least a cycle of the first clock signal, controlling the slave apparatus to assert, when it is detected that the first data signal line has been asserted for a period of time longer than at least the cycle of the first clock signal, the second data signal line for a period of time longer than at least a cycle of the second clock signal, controlling the master apparatus to cancel, when it is detected that the second data signal line has been asserted for a period of time longer than at least the cycle of the second clock signal after the first data signal line was asserted in the controlling the master apparatus to assert, the assertion of the first data signal line, controlling the slave apparatus to cancel, when it is detected that the first data signal line has not been asserted for a period of time longer than at least the cycle of the first clock signal after the second data signal line was asserted in the controlling the slave apparatus to assert, the assertion of the second data signal line while deciding that the master apparatus is in a communicable state, and causing the master apparatus to decide, when it is detected that the second data signal line has not been asserted for a period of time longer than at least the cycle of the second clock signal after the assertion of the first data signal line was cancelled in the controlling the master apparatus to cancel, that the slave apparatus is in a communicable state.

10. A serial communication apparatus comprising:

a first clock terminal configured to transmit a first clock signal to a first clock signal line;

a first data terminal configured to transmit a first data signal to a first data signal line;

a second clock terminal configured to receive a second clock signal from a second clock signal line;

a second data terminal configured to receive a second data signal from a second data signal line; and a decision unit configured to decide whether said serial communication apparatus and a communicable partner apparatus are connected via said first clock terminal, said first data terminal, said second clock terminal, and said second data terminal, said decision unit comprising a driving unit configured to control to assert the first data signal line for a period of time longer than at least a cycle of the first clock signal, a decision unit configured to decide whether the second data signal line has been asserted, a cancellation unit configured to control to cancel, when said decision unit detects that the second data signal line has been asserted for a period of time longer than at least a cycle of the second clock signal after said driving unit asserted the first data signal line, the assertion of the first data signal line, and a connection decision unit configured to decide, when said decision unit detects that the second data signal line has not been asserted for a period of time longer than at least the cycle of the second clock signal after said cancellation unit canceled the assertion of the first data signal line, that the communicable partner apparatus is connected.

* * * * *